United States Patent [19]

Aitchison

[11] Patent Number: 4,908,529

[45] Date of Patent: Mar. 13, 1990

[54] LOGARITHMIC AMPLIFIER COMPRISING MESFET DISTRIBUTED AMPLIFIERS CONNECTED IN CASCADE

[76] Inventor: Colin S. Aitchison, 37 Cronks Hill Road, Redhill, Surrey, England

[21] Appl. No.: 321,506

[22] Filed: Mar. 9, 1989

[30] Foreign Application Priority Data

Mar. 10, 1988 [GB] United Kingdom .................. 8805669

[51] Int. Cl.[4] .......................... G06G 7/24; H03K 5/08

[52] U.S. Cl. .................................... 307/492; 307/497; 328/145

[58] Field of Search ....................... 307/442, 497, 571; 328/145

[56] References Cited

U.S. PATENT DOCUMENTS 3,061,789 10/1962 Mace .................................. 307/492

3,373,294 11/1964 Fujinami ............................ 307/492

4,209,714 6/1980 Miyamoto ........................... 307/229

4,531,069 7/1985 Parker ................................ 307/492

4,720,673 1/1988 Hatfield ............................ 324/77 B 4,812,772 3/1989 Hatfield .............................. 307/492

4,853,564 8/1989 Smith et al. ......................... 307/492

*Primary Examiner*—Stanley D. Miller

*Assistant Examiner*—Terry Cunningham

*Attorney, Agent, or Firm*—Leon Gilden

[57] ABSTRACT

Logarithmic amplifiers which have a logarithmic transfer characteristic are used, for example, in microwave instrumentation. Such an amplifier comprises a series of MESFET distributed amplifiers (DA1-DA8), each having a substantially linear transfer characteristic, connected in cascade. An input for the logarithmic amplifier is connected to an input end of the gate transmission line (G) of a first distributed amplifier (DA1) and the output end of the gate transmission line of each distributed amplifier is terminated by a demodulator (DM1-DM8) for demodulating amplitude modulation. Summing means (OP1) are connected to the output of each of the demodulators (DM1-DM8) to sum their outputs and thereby provide the output of the logarithmic amplifier.

8 Claims, 2 Drawing Sheets

LOGARITHMIC AMPLIFIER COMPRISING MESFET DISTRIBUTED AMPLIFIERS CONNECTED IN CASCADE

BACKGROUND OF THE INVENTION

Logarithmic amplifiers which are amplifiers having a logarithmic transfer characteristic, are used widely and one example of their use is in microwave instrumentation.

At present logarithmic amplifiers comprise a number of amplifiers having a linear characteristic connected sequentially via hybrid couplers. Each of the hybrid couplers is connected to a demodulator for demodulating an amplitude modulated signal and these are commonly known as video detectors. The outputs from all of the demodulators are then summed to provide the logarithmic output of the amplifier.

It is also known to use a single amplifier with a linear characteristic and then to apply the output of the linear amplifier to a demodulator for demodulating an amplitude modulated signal with the demodulator itself having a logarithmic transfer characteristic so that the output from the demodulator provides the logarithmic output from the amplifier.

Conventional linear amplifiers for operating at microwave frequencies usually include both a resonant input stage and a resonant output stage and accordingly they, and any resulting logarithmic amplifiers including them, only have a limited bandwidth. This gives rise to difficulties when the resulting logarithmic amplifiers are required to handle short pulses for which a large bandwidth is required. Amplifiers capable of operating at microwave frequencies are expensive and previous attempts to improve their bandwidth have resulted in the further increase in their cost.

SUMMARY OF THE INVENTION

According to this invention a logarithmic amplifier comprises a series of MESFET distributed amplifiers connected in cascade, each having a substantially linear transfer characteristic, an input for the logarithmic amplifier being connected to an input end of the gate transmission line of a first distributed amplifier and the output end of the gate transmission line of each distributed amplifier being terminated by a demodulator for demodulating amplitude modulation, and summing means connected to the output of each of the demodulators to sum their outputs and thereby provide the output of the logarithmic amplifier.

As a signal input into the first distributed amplifier passes through the series of distributed amplifiers it is increased in level until, initially the final demodulator operates non-linearly and produces an output. For larger input signals more of the demodulators produce an output. All of the outputs are summed in the summer to provide the output from the logarithmic amplifier.

Preferably each demodulator includes a simple rectifier formed by a pn junction. When the demodulator acts non-linearly it rectifies and produces a rectified output which is a DC voltage for a constant carrier wave signal or a demodulated signal for an amplitude modulated carrier wave, which for each amplifier, is invariant. Each demodulator may also include a low pass circuit connected downstream of its rectifier. The gate transmission line of each amplifier may include a resistive load matched to the characteristic impedance of the gate transmission line or, alternatively, the corresponding demodulator may have an impedance equivalent to that of the gate transmission line and so replace the impedance matching resistor of the gate transmission line. The summer is preferably formed by an operational amplifier having the outputs from each of the demodulators connected to its input.

MESFET distributed amplifiers have a very broad bandwidth and accordingly a logarithmic amplifier in accordance with this invention is capable of handling pulses having a very short rise time of the order tens of pico seconds. GaAs MESFET distributed amplifiers capable of handling signals from 20 MHz to 50 GHz are relatively cheap and can be readily formed as a monolithic integrated circuit or a hybrid integrated circuit in which all of the components are manufactured separately and then mounted on a microwave substrate.

The number of distributed amplifiers connected in cascade depends upon the required dynamic range of the logarithmic amplifier. Typically distributed amplifiers including, for example, four GaAs MESFETs having a gain of between 6 and 10 dB. Thus, for a logarithmic amplifier to have a dynamic range of 70 dB, between 7 and 12 distributed amplifiers are connected together in cascade. Usually 8 or 9 are connected together.

BRIEF DESCRIPTION OF THE DRAWINGS

A particular example of a logarithmic amplifier in accordance with this invention will now be described with reference to the accompanying drawings, in which.

DESCRIPTION OF PREFERRED EXAMPLE

This example of a logarithmic amplifier includes eight distributed amplifiers DA1 to DA8 connected together in cascade. Each distributed amplifier DA1 to DA8 has a demodulator DM1 to DM8 associated with its gate transmission line and the outputs of these are connected to a summer OP1.

Figure 2:
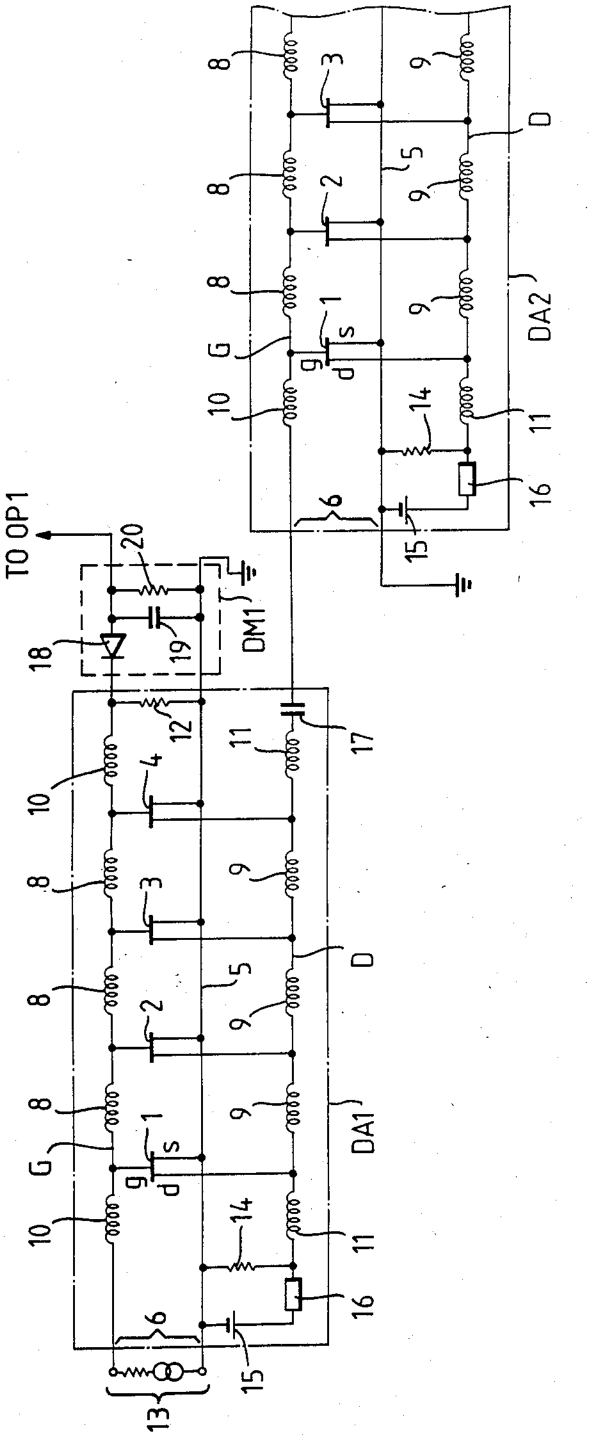
FIG. 2 is a circuit diagram of part of the logarithmic amplifier showing the construction of the first distributed amplifier and part of the second; and, FIG. 3 is a graph illustrating the linearity of a single stage distributed amplifier at a variety of frequencies.

Each distributed amplifier includes four GaAs MESFETs 1 to 4 with their gate electrodes g connected to a gate transmission line G, their drain electrodes d connected to a drain transmission line D and their source electrodes s connected to a ground plane 5. An input 6 to the first distributed amplifier DA1 forms the input to the logarithmic amplifier. The gate transmission lines G include inductors 8 connected between the gate electrodes of successive transistors 1, 2, 3 and 4 and inductors 10 in the end sections of the line. The drain transmission line D includes inductors 9 connected between the drain electrodes of adjacent transistors 1, 2, 3 and 4 and inductors 11 in the end sections of the line. The gate transmission line G is terminated at its right hand end, as seen in FIG. 2 by a resistor 12 which matches the characteristic impedance of the line. The left hand side of the gate transmission line is terminated by a generator 13 whose signal is to be amplified and which has a source impedance equal to the gate line characteristic impedance. The drain transmission line D includes at its left hand end a resistor 14 matching the characteristic impedance of the line. A DC source 15 is connected to the source line 5 and to the junction of the resistor 14 and adjacent inductor 11 or the drain transmission line D via a low pass filter 16 to provide bias for the drain electrodes of the transistors 1 to 4. A DC blocking capacitor 17 is included at the right end of the drain transmission line D.

In use a microwave signal fed into the input 6 is amplified by the successive transistors 1 to 4. A respective travelling wave passes along each of the gate G and drain D transmission lines and with each line correctly terminated the gain of the amplifier is substantially independent of the frequency of the microwave signal. Typically with four transistors a gain of 6 dB is obtained.

The demodulators DM1 to DM8 comprise a diode 18 connected to the right hand end of the gate line G and a low pass filter circuit formed by capacitor 19 and resistor 20 connected in parallel between the gate line G and the source line 5. The diode 18 and low pass filter 19 and 20 rectify the travelling wave passing along the gate line G and allow to pass only the amplitude modulation of the travelling wave signal passing along the gate line G and a d.c component of the carrier wave signal. This signal is applied as one input to an eight input summer formed by an operational amplifier OP1.

The right hand end of the drain transmission line D of distributed amplifier DA1 is connected across the input 6 of distributed amplifier DA2 to connect the amplifiers DA1 and DA2 in cascade. This connection is repeated throughout each of the stages. All of the distributed amplifiers DA1 to DA8 and demodulators DM1 to DM8 are similar except that the right hand end of the drain transmission line D in distributed amplifier DA8 is terminated by an impedance matching resistor (not shown) the resistance of which matches the characteristic impedance of that of the drain transmission line D.

Figure 1:
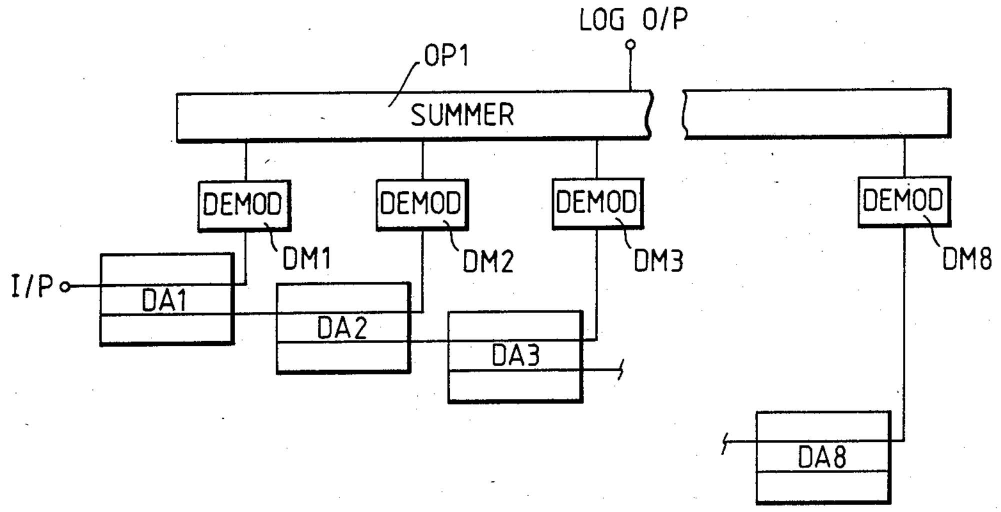
FIG. 1 is a block diagram of the logarithmic amplifier.
Figure 3:
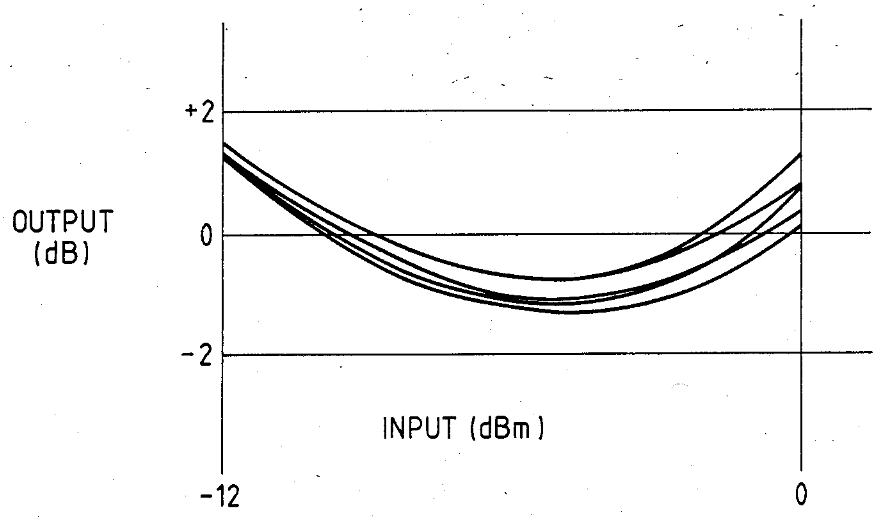

FIG. 3 is a graph illustrating the linearity of a single stage distributed amplifier in accordance with this invention over a dynamic range of 12 dB at frequencies of 2, 3, 4, 5 and 6 GHz. The graph illustrates how the amplifier provides a substantially similar response over this frequency range and a reasonably constant output over the dynamic range.

I claim:

1. A logarithmic amplifier comprising:

a series of MESFET distributed amplifiers connected in cascade, said MESFET distributed amplifiers having a substantially linear transfer characteristic, an input for said logarithmic amplifier being provided by an input end of a gate transmission line of a first distributed amplifier, demodulator means, said demodulator means being operatively connected to terminate said gate transmission line of each distributed amplifier, said demodulator means demodulating amplitude modulated signals, and, summing means operatively connected to each of said demodulator means, said summing means summing outputs of said demodulator means and thereby providing an output of said logarithmic amplifier.

2. The logarithmic amplifier of claim 1, wherein each demodulator means includes a simple rectifier formed by a pn junction.

3. The logarithmic amplifier of claim 2, wherein each demodulator includes a low pass circuit, said low pass circuit being connected to the output side of said simple rectifier.

4. The logarithmic amplifier gate transmission line of claim 1, wherein each distributed amplifier includes a resistive load matched to a characteristic impedance of the gate transmission line.

5. The logarithmic amplifier of claim 1, wherein said summing means is formed by a multi-input operational amplifier and each said demodulator means being operatively connected to a different one of said multi-inputs.

6. The logarithmic amplifier of claim 1 wherein said MESFET distributed amplifiers include GaAs MESFETs.

7. The logarithmic amplifier of claim 1, wherein said distributed amplifiers are capable of handling microwave signals having a frequency in a range from 20 MHz to 50 GHz.

8. The logarithmic amplifier of claim 7, wherein each distributed amplifier includes four MESFETs and eight of said distributed amplifiers are connected in cascade.

* * * * *